United States Patent
Gorbachov

(10) Patent No.: US 9,065,385 B2
(45) Date of Patent: Jun. 23, 2015

(54) SPUR CANCELLATION IN GSM-GPRS-EDGE POWER AMPLIFIERS WITH DC-DC CONVERTERS

(71) Applicant: RFAXIS, INC., Irvine, CA (US)

(72) Inventor: Oleksandr Gorbachov, Irvine, CA (US)

(73) Assignee: RFAXIS, INC., Irvine, CA (US)

( * ) Notice: Subject to any disclaimer, the term of this patent is extended or adjusted under 35 U.S.C. 154(b) by 52 days.

(21) Appl. No.: 14/067,548

(22) Filed: Oct. 30, 2013

(65) Prior Publication Data
US 2014/0118075 A1    May 1, 2014

Related U.S. Application Data

(60) Provisional application No. 61/720,125, filed on Oct. 30, 2012.

(51) Int. Cl.
| | |
|---|---|
| H03F 1/30 | (2006.01) |
| H03F 1/02 | (2006.01) |
| H03F 3/19 | (2006.01) |
| H03F 3/24 | (2006.01) |

(52) U.S. Cl.
CPC ............... *H03F 1/0227* (2013.01); *H03F 1/30* (2013.01); *H03F 3/19* (2013.01); *H03F 3/245* (2013.01)

(58) Field of Classification Search
CPC .......................................... H03F 1/30
USPC ......................... 330/297, 285, 296
See application file for complete search history.

(56) References Cited

U.S. PATENT DOCUMENTS

| | | | | |
|---|---|---|---|---|
| 5,834,977 | A * | 11/1998 | Maehara et al. | 330/297 |
| 6,639,471 | B2 * | 10/2003 | Matsuura et al. | 330/302 |
| 7,420,411 | B2 * | 9/2008 | Herzinger et al. | 330/10 |
| 8,085,095 | B2 * | 12/2011 | Young et al. | 330/297 |
| 8,669,811 | B2 * | 3/2014 | Le Gallou et al. | 330/136 |

* cited by examiner

*Primary Examiner* — Henry Choe
(74) *Attorney, Agent, or Firm* — Stetina Brunda Garred & Brucker

(57) ABSTRACT

A radio frequency (RF) power amplifier circuit with spur cancellation for GSM/GPRS/EDGE transceivers is disclosed. There is a power amplifier with an RF input, an RF output, and a voltage supply input. Additionally, there is an adjustable DC-DC converter with an input connected to a battery, an output connected to the voltage supply input of the power amplifier with a DC supply voltage signal generated thereby. A spur compensator generates an error control signal responsive to spurs in the DC supply voltage signal. The error control signal is applied to the RF input of the power amplifier.

23 Claims, 6 Drawing Sheets

SPUR CANCELLATION IN GSM-GPRS-EDGE POWER AMPLIFIERS WITH DC-DC CONVERTERS

CROSS-REFERENCE TO RELATED APPLICATIONS

This application relates to and claims the benefit of U.S. Provisional Application No. 61/7220,125 filed Oct. 30, 2012 and entitled SPUR CANCELLATION IN GSM-GPRS-EDGE POWER AMPLIFIERS WITH DC-DC CONVERTERS, which is wholly incorporated by reference in its entirety herein.

STATEMENT RE: FEDERALLY SPONSORED RESEARCH/DEVELOPMENT

Not Applicable

BACKGROUND

1. Technical Field

The present disclosure relates generally to radio frequency (RF) signal circuitry, and more particularly, to spur cancellation in GSM-GPRS-EDGE power amplifiers with DC-DC converters.

2. Related Art

Wireless communications systems find application in numerous contexts involving data transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide.

Generally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System) that includes third generation (3G) modalities such as W-CDMA (Wideband Code Division Multiplexing), and fourth generation (4G) such as LTE (Long Term Evolution).

A fundamental component of mobile handsets, or any wireless communications system for that matter, is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Conventional mobile handset transceivers typically do not generate sufficient power or have sufficient sensitivity for reliable communications standing alone. Thus, additional conditioning of the RF signal is necessary. The circuitry between the transceiver and the antenna that provide this functionality is referred to as the front-end module, which include a power amplifier for increased transmission power, and/or a low noise amplifier for increased reception sensitivity.

Ultimately, all of the components of a mobile handset are powered from a battery with a peak output of approximately 4 volts, but different components have varying voltage supply requirements. Moreover, the common rechargeable lithium-ion batteries slightly decrease in output voltage as energy is depleted. Thus, conventional power amplifiers of CDMA front end circuits utilize DC-DC converters to increase and maintain the supply voltage at the required levels. The need for higher efficiency power conversion has been more pronounced in CDMA/WCDMA applications rather than GSM/GPRS/EDGE applications because the former has a greater power output dynamic range. Additionally, CDMA/WCDMA handsets consume more power because the onboard central processors execute more instructions and operate at higher data rates. On the other hand, first and second generation GSM handsets, which utilize 0.25-0.35 μm Silicon integrated circuit substrate technology, could not achieve significant power consumption reductions at the power amplifier level because the digital and analog baseband circuitry, as well as RF modulation circuitry, were more significant power drains in comparison. Additionally, single-slot GSM/GPRS/EDGE operation restrictions imposed by earlier mobile network infrastructure contributed to reduced power consumption by the headset devices.

With GSM/GPRS/EDGE handsets, there are primarily two different modalities of controlling the output power of the RF power amplifier with a fixed RF input power. One modality is base/gate current or voltage control, and the second modality is collector/drain voltage control, depending on the transistor technology utilized, e.g., bipolar junction or heterojunction bipolar, or metal-semiconductor field effect, metal oxide semiconductor field effect, or high electron mobility. In either configuration, power is applied to the base of each RF transistor stage through a resistor or a current mirror circuit. With most implementations, the transistors of the power control circuitry at low to mid RF output power levels consumes battery power, decreasing efficiency. To the extent any earlier devices addressed power amplifier power source efficiency, those attempts were focused on maximum output power levels.

However, in most urban environments, the average distance to a base station is not so extensive as to constantly require high power outputs. Indeed, according to the GSM Gaussian minimum shift keying (GMSK) probability distribution function, the output power at the handset antenna is 18 dBm to 27 dBm a majority of the time. Thus, talk times can be significantly improved with greater power supply conversion efficiencies at low to mid-level power outputs. Accordingly, there is a need in the art for input voltage controlled GSM/GPRS/EDGE power amplifiers having greater efficiency across all output levels.

There are several deficiencies associated with utilizing the aforementioned DC-DC converters in GSM/GPRS/EDGE operating modes that heretofore was insurmountable. As is well understood, the output of DC-DC converters has voltage ripples that vary depending upon inductance and capacitance values of the components chosen for the output filter needed to meet voltage settling time requirements. In general, the lower the output voltage level, the higher the relative voltage ripple. Additionally, the voltage ripple is dependent on the conversion mode of the DC-DC converter, e.g., pulse-width modulation (PWM), pulse-frequency modulation (PFM), skip mode, and so forth. The power control curve of conventional GSM power amplifiers, whether controlled through the base/gate or through the collector/drain, has variable control voltage sensitivities. That is, at lower RF output levels, a lower voltage increase is needed for the same increase in output power as is needed for higher RF output power levels. The foregoing performance characteristics of DC-DC converters result in an increase of local oscillation therein, which produces increased level of spurs in the mid to low power output levels of the power amplifier.

The voltage ripples at the output of the DC-DC converts, in turn, results in an amplitude modulation being applied to the RF signal. Thus, spur spectrum components appear at the local oscillator frequency offsets from the main RF signal. These include the continuous wave signal spur, as well as others across a wide spectrum that depends on the DC-DC converter operation mode and the selected output filter components. These spur signals may be at such levels that violate the strict spectrum purity requirements as defined by the GSM standard (e.g., GSM05.05).

There is accordingly a need in the art for adjustable DC-DC converters for GSM/GPRS/EDGE power amplifier power control applications, but which also satisfy maximum operating current and high speed voltage ramping requirements, while minimizing noise. More particularly, there is a need for DC-DC converters that utilize a higher local oscillator frequency than the RF signal bandwidth, (which for GSM/GPRS/EDGE is 200 kHz) while still retaining values and sizes of external filter components that are suitable for use in handset applications.

BRIEF SUMMARY

The present disclosure contemplates embodiments of power control circuits for supplying variable voltage levels (Vcc, Vdd) to radio frequency (RF) power amplifiers utilized in GSM, GPRS, and EDGE wireless communications transmissions. These circuits may incorporate efficient and power-saving DC-DC converters, and include features that address the aforementioned spur signal concerns. The circuitry may be embodied in a unitary RF front end device that can be incorporated into mobile handset devices. With the use of the disclosed power control circuits, it is expected that GSM/GPRS/EDGE talk times can be significantly increased because battery current consumption can be reduced by 20-50% depending on the semiconductor technology, baseband analog circuitry, and multiple-slot operation.

In accordance with one embodiment of the disclosure, there is a radio frequency (RF) power amplifier circuit. It may include a power amplifier with an RF input, an RF output, and a voltage supply input. Additionally, it may include an adjustable DC-DC converter with an input connected to a battery, an output connected to the voltage supply input of the power amplifier with a DC supply voltage signal generated thereby. There may also be a spur compensator that generates an error control signal responsive to spurs in the DC supply voltage signal. The error control signal may be applied to the RF input of the power amplifier.

A first embodiment of an RF power amplifier circuit may include a power amplifier block, a power converter block, and a spur compensation block. The power amplifier block may include one or more stages of RF power amplifiers with a power amplifier input connectible to an RF transceiver transmission port. There may also be a power amplifier output connectible to an antenna, as well as a power amplifier reference input that can be tied to the power amplifier input. The power converter block may include a DC-DC power converter with a converter bias input connectible to a DC source. The converter output may be connectible to the power amplifier block to bias the one or more stages of RF power amplifiers with a bias voltage signal. The DC-DC power converter may also have a converter feedback, along with a converter reference input that may be connected to a voltage control signal source corresponding to an RF power output level. The spur compensation block may include an error amplifier. The converter feedback and the converter output may be connected to a first input of the error amplifier. The voltage control signal source may be connected to a second input of the error amplifier through a phase adjustment network. Furthermore, an output of the error amplifier may generate an error control signal and may be connected to the power amplifier reference input together with a reference voltage signal source. The bias voltage signal may be opposite the error control signal, with voltage ripple spurs in the bias voltage signal being counteracted by the error control signal.

A second embodiment of the RF power amplifier circuit contemplates closed-loop control RF power amplifier circuit. There may be a power amplifier block including one or more stages of RF power amplifiers with a power amplifier input connectible to an RF transceiver transmission port. The power amplifier block may also include a power amplifier output connectible to an antenna, and a power amplifier reference input tied to the power amplifier input. There may also be a power converter block including a DC-DC power converter with a converter bias input connectible to a DC source. The power converter block may further include a converter output connectible to the power amplifier block to bias the one or more stages of RF power amplifiers with a bias voltage signal, a converter feedback, and a converter reference input. The second embodiment of the RF power amplifier circuit may also include a spur compensation block that has a first error amplifier and a second error amplifier each including a first input, a second input, and an output. The converter feedback and the converter output may be connected to the first input of the first error amplifier. The output of the second error amplifier may be connected to the second input of the first error amplifier through a phase adjustment network and the converter reference input. The output of the first error amplifier may generate an error control signal and connected to the power amplifier reference input together with a reference voltage signal source. The first input of the second error amplifier may be connected to a voltage control signal source. Furthermore, the second embodiment of the RF power amplifier circuit may include a power detector block with an input connected to the power amplifier output and an output connected to the second input of the second error amplifier.

A third embodiment of an RF power amplifier circuit may be directed to an alternative control modality. There may be a power amplifier block including one or more stages of RF power amplifiers with a power amplifier input connectible to an RF transceiver transmission port. The power amplifier block may also include a power amplifier output that is connectible to an antenna. Additionally, the power amplifier block may include a power amplifier control input tied to the power amplifier input. The power amplifier circuit may further include a power converter block that has a DC-DC power converter with a converter bias input connectible to a DC source. A converter output may be connectible to the power amplifier block to bias the one or more stages of RF power amplifiers with a bias voltage signal. A converter feedback and a converter reference input connected to a stepped voltage reference signal source may correspond to an RF power output level. The power amplifier circuit may also include a spur compensation block with an error amplifier. The converter feedback and the converter output may be connected to a first input of the error amplifier. The stepped voltage reference signal source may be connected to a second input of the error amplifier through a phase adjustment network. An output of the error amplifier may generate an error control signal and may be connected to the power amplifier reference input together with a voltage control signal source. The bias voltage signal may be opposite the error control signal, with voltage ripple spurs in the bias voltage signal being counteracted by the error control signal.

A fourth embodiment of an RF power amplifier circuit utilizes an alternative closed loop control modality. The circuit may include a power amplifier block with one or more stages of RF power amplifiers with a power amplifier input connectible to an RF transceiver transmission port, a power amplifier output connectible to an antenna, and a power amplifier control input tied to the power amplifier input. The circuit may also include a power converter block with a DC-DC power converter that has a converter bias input connectible to a DC source. The power converter block may also include a converter output connectible to the power amplifier block to bias the one or more stages of RF power amplifiers with a bias voltage signal. Furthermore, the power converter may include a converter feedback and a converter reference input connected to a stepped voltage reference signal source that corresponds to an RF power output level. The circuit may additionally incorporate a spur compensation block with an error amplifier. The converter feedback and the converter output may be connected to a first input of the error amplifier, and the stepped voltage reference signal source may be connected to a second input of the error amplifier through a phase adjustment network. An output of the error amplifier may generate an error control signal and may be connected to the power amplifier reference input together with a voltage control signal source. There may also be a power detector block that includes an input connected to the power amplifier output and an output connected to the second input of the second error amplifier.

According to a fifth embodiment, an open-loop control RF power amplifier circuit is disclosed. There may be a power amplifier block including one or more stages of RF power amplifiers with a power amplifier input connectible to an RF transceiver transmission port and a power amplifier output connectible to an antenna. There may also be a voltage converter and spur compensation block. This may include a DC-DC converter with a converter bias input connectible to a DC source, a converter output, a converter feedback, and a converter reference input connected to a stepped voltage reference signal source. Furthermore, the voltage converter and spur compensation block may include a first error amplifier with a first input, a second input, and an output. The converter feedback and the converter output may be connected to the first input of the first error amplifier, and the output may be connected to the power amplifier input. There may additionally be a phase adjustment network that is connected to the stepped voltage reference signal source and the second input of the first error amplifier. The power amplifier circuit may also include a current sense and control block with an input connected to the voltage converter and spur compensation block, and an output connected to the power amplifier block. The current sense and control block may be comprised of a second error amplifier having a first input connected to a voltage control signal source, a second input connected to the converter output, and an output. The current sense and control block may also include a third error amplifier with a first input connected to the output of the second amplifier, a second input, and an output connected to the power amplifier input. Furthermore, there may be a sensing resistor that is connected across the second input of the second error amplifier and the second input of the third error amplifier. The second input of the third error amplifier may define the output of the current sense and control block.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

A radio frequency power amplifier circuit utilizing a DC-DC converter for supplying variable voltages to GSM/GPRS/EDGE power amplifiers from a single voltage battery is disclosed. The detailed description set forth below in connection with the appended drawings is intended as a description of the presently preferred embodiments of the power amplifier circuit, and is not intended to represent the only form in which they may be developed or utilized. The description sets forth the functions in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
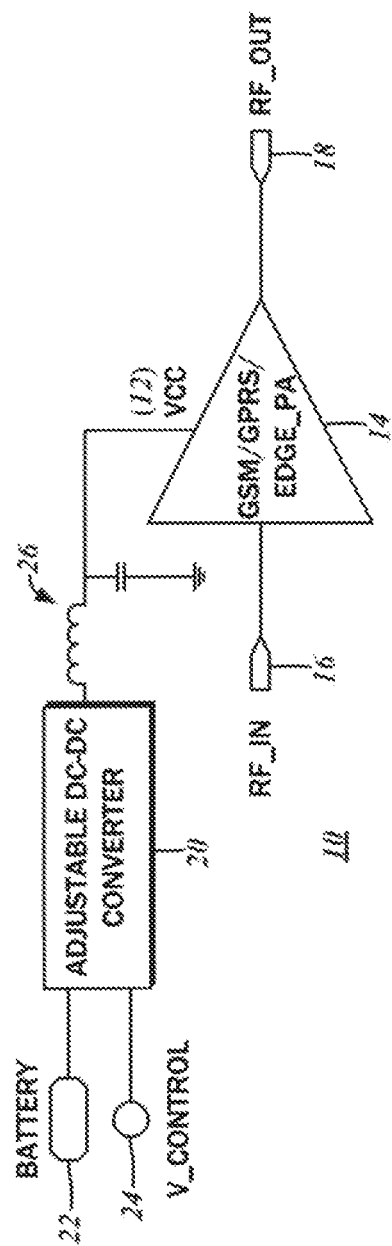
FIG. 1 is a circuit diagram generally illustrating a power control circuit in accordance with various embodiments of the present disclosure, including an adjustable DC-DC converter for providing variable power to a power amplifier from a battery.

With reference to the circuit diagram of FIG. 1, a simplified embodiment of the RF power amplifier circuit 10 is shown. As understood, the various implementations are used to supply variable voltage levels (Vcc or Vdd 12) to a power amplifier 14 that is transmitting in accordance with the GSM/GPRS/EDGE mobile communications network. However, it is understood that the same implementations could be used to likewise supply variable voltages to a CDMA/WCDMA transmission power amplifiers. As will be appreciated by those having ordinary skill in the art, the use of DC-DC converters with CDMA/WCDMA power amplifiers is a common practice. While the features disclosed herein are understood to reduce power consumption by GSM/GPRS/EDGE power amplifiers in particular with the use of DC-DC converters while eliminating problematic spur noise associated therewith, as will be discussed in further detail below, they are understood to be applicable in the CDMA/WCDMA context, or any other mobile communications modality. In this regard, reference to the GSM/GPRS/EDGE power amplifier 14 is not intended to be limiting. Accordingly, this component may be more generally referred to as the power amplifier 14.

An RF-modulated signal may be passed from a transceiver (not shown) to an RF_IN port 16, amplified in accordance with the configuration of the power amplifier 14, and passed to an RF_OUT port 18 that may be connected directly to an antenna or an antenna switch network or diplexer device that selectively switches the connection of the antenna to the transmission circuitry or the reception circuitry. In accordance with various embodiments of the present disclosure, there is also an adjustable DC-DC converter 20 which changes a constant DC voltage from a battery 22 typically 3.6V to 4.0V, to a different voltage as needed by the power amplifier 14. Depending on the distance to the base station, as well as the presence of noise and other interferences, the output power level required to reliably carry on communications may differ. To set the power amplifier 14 to output different power levels, the supply voltage 12 thereto is adjusted, as defined by a voltage control input 24. In the contemplated embodiments, the DC-DC converter 20 is a highly efficient switched mode converter that may produce unintended spur signals, so the DC signal passed to the power amplifier 14 may first be passed through a filter circuit 26 generally comprised of an inductor/capacitor (LC) network.

Figure 2:
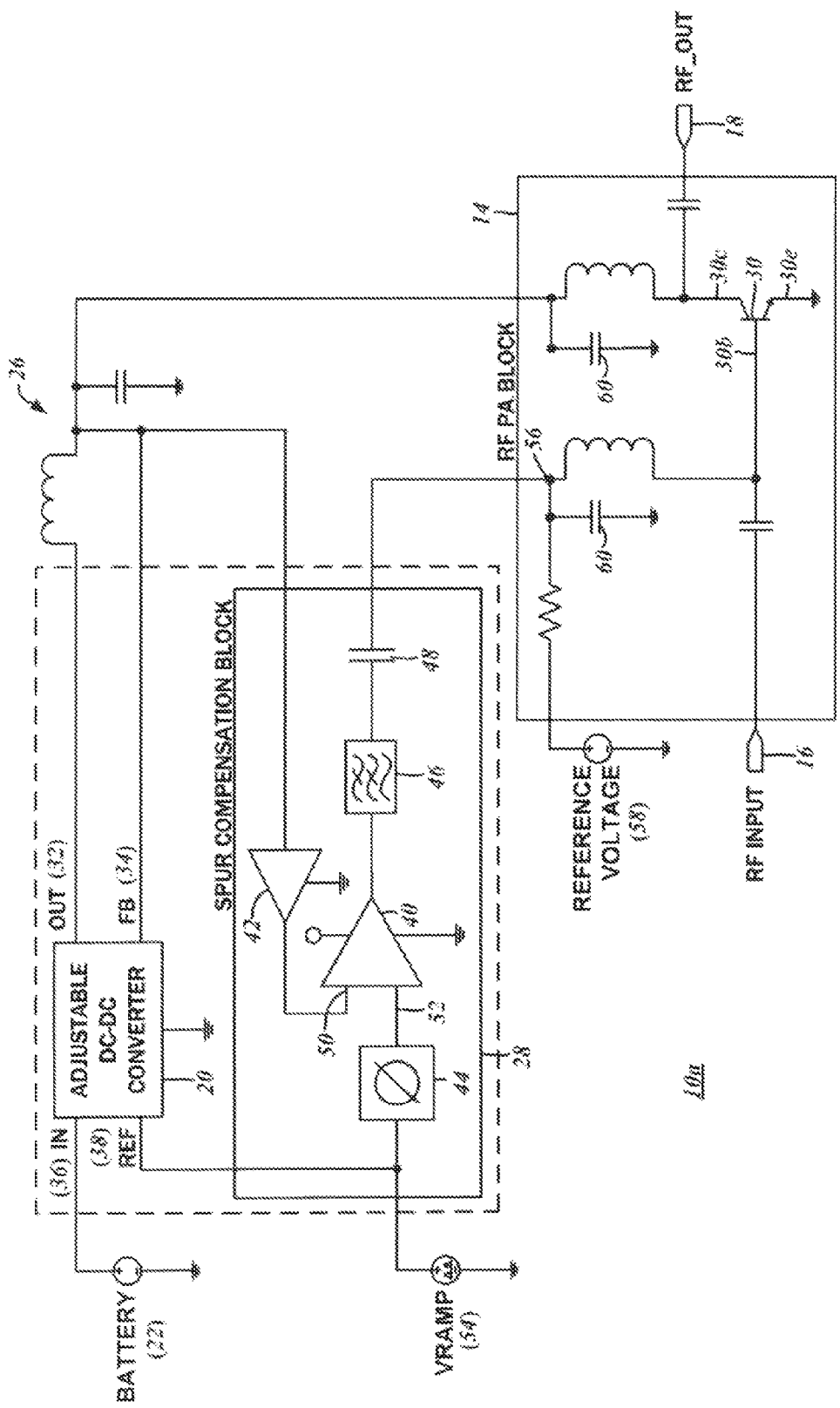
FIG. 2 is a circuit diagram of a first embodiment of the power control circuit including the DC-DC converter and local oscillation spur rejection.

In addition to the aforementioned components of the power amplifier circuit 10, as shown in an exemplary first embodiment 10a of FIG. 2, there is a spur compensator 28 (also referred to as a spur compensator block) that generates an error control signal that is responsive to spurs in the DC supply voltage signal. As will be described in further detail below, the error control signal is applied to a control terminal, which in turn is connected to the RF input 16 of the power amplifier 14 (also referred to as a power amplifier block) through a matching network in order to minimize the effects of local oscillation spur signals generated by the DC-DC converter 20. In multi-stage power amplifiers, the error control signal can be applied to each base/gate of the power amplifier transistors.

Again, the first embodiment of the power amplifier circuit 10a shown in FIG. 2 includes the power amplifier block 14 that has one or more power amplifier stages. In the illustrated example, only a single stage is depicted by a one transistor 30 that has a base 30b, a collector 30c, and an emitter 30e. However, this is only for purposes of simplification, and not intended to be limiting, as conventional power amplifier implementations typically include multiple amplification stages. Moreover, it is to be understood that while a bipolar junction transistor and its components are depicted herein, any other suitable transistor can be substituted, such as field effect types. In such case, the term gate is to be substituted for base, the term drain is to be substituted for collector, and the term source is to be substituted for emitter. The base 30b is connected to the RF input 16, which, in turn, is connected to a previous stage of the RF system, e.g., a transceiver. The collector 30c, which corresponds to an output of the power amplifier block 14, is connected to the RF output 18 that is subsequently connected to one or more antennas through a diplexer or other switching network. The emitter 30e is connected to ground.

The transistor 30 is biased with a DC supply voltage/signal that is generated by the DC-DC converter 20 and applied to the collector 30c. In this regard, the DC-DC converter 20 includes a converter output 32, a converter feedback 34. Furthermore, a converter bias input 36 of the DC-DC converter 20 is connectible to the battery/DC source 22. The DC-DC converter 20 also has a converter reference input 38 that generally corresponds to the aforementioned voltage control input 24 shown in FIG. 1.

The power amplifier circuit 10a also includes the earlier mentioned spur compensation block 28, which is generally comprised of an error amplifier 40, a gain adjustment network 42, a phase adjustment network 44, an output low pass filter circuit 46, and an output DC blocking capacitor 48. The DC-DC converter 20 and all of these components of the spur compensation block 28 may be implemented on a single semiconductor die. Connected to a first input 50 of the error amplifier 40 are the aforementioned converter feedback 34 and the converter output 32. More particularly, the converter feedback 34 and the converter output 32 are first amplified with the gain adjustment network 42 before being applied to the first input 50. Connected to a second input 52 of the error amplifier 40 is a voltage control signal source 54, also referred to as an external voltage control signal VRAMP. Again, this is understood to be the voltage control input 24 that defines the RF power amplifier output power level and its burst operation. The appropriate shape and rise/fall time slopes is applied through the phase adjustment network 44 to the second input 52 of the error amplifier 40. This same signal is also applied to the converter reference input 38.

An output of the error amplifier 40, referred to as an error control signal, after filtering by the output low pass filter circuit 46 and the output DC blocking capacitor 48, is passed to a power amplifier reference input 56 connected to the RF input 16 or the transistor base 30b. Also connected to the power amplifier reference input 56 is a reference voltage signal source 58, which in the first embodiment 10a, is understood to be a DC voltage. At both the power amplifier reference input 56 and the output of the DC-DC converter 20, there are RF blocking capacitors 60.

In the power amplifier circuit 10a, the DC-DC converter 20 is understood to generate the DC bias voltage signal for the power amplifier block 14, specifically applied to the collector 30c of the transistor 30, and may include voltage ripple spurs. These spurs are understood to be the opposite in phase of spurs included in the error control voltage signal generated by the spur compensation block 28, and are applied to the base 30b. The higher the voltage ripple at the converter output 32 of the DC-DC converter 20, the higher the error control voltage that is applied to the base. With proper tuning of the gain adjustment network 42 and the phase adjustment network 44, it is contemplated that the spur compensation block 28 is capable of fully discharging spurs at the output of the power amplifier block 14 that originates from the DC-DC converter 20. The configurations of the gain adjustment network 42 and the phase adjustment network 44 are also understood to be dependent on the base-collector power control curves of the particular transistor 30 being utilized in the power amplifier block 14.

Figure 3:
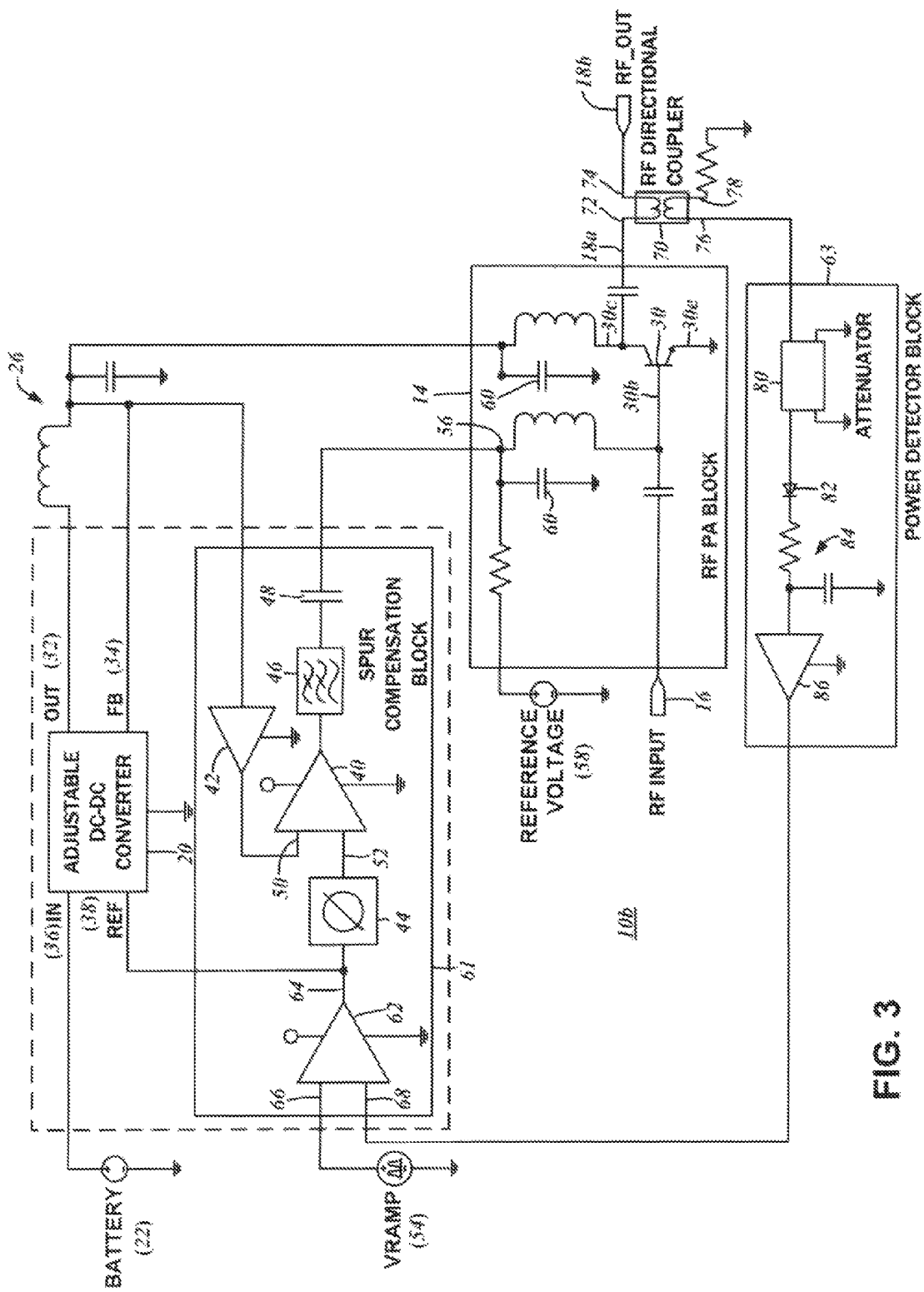
FIG. 3 is a circuit diagram of a second embodiment of the power control circuit with closed-loop power control.

Referring now to FIG. 3, a second embodiment 10b of the power amplifier circuit that utilizes closed-loop control will be considered. Most of same functional blocks discussed above in relation to the first embodiment 10a are used in the second embodiment 10b, including the identical power amplifier block 14 and the DC-DC converter 20. However, a differently configured spur compensation block 61 is utilized, the details of which will be discussed more fully below. Additionally, the second embodiment 10b utilizes true RF power detection, and accordingly includes a power detection block 63.

The power amplifier block 14 includes the RF input 16 and the RF output 18, as well as the transistor 30. The base 30b thereof is connected to the RF input 16, which, in turn, is connected to a previous stage of the RF system. The collector 30c, which corresponds to an output of the power amplifier block 14, is connected to the RF output 18 that is subsequently connected to one or more antennas through a diplexer or other switching network. The emitter 30e is connected to ground. The transistor 30 is biased with the DC supply voltage/signal that is generated by the DC-DC converter 20 and applied to the collector 30c. Again, the DC-DC converter 20 includes the converter output 32 and the converter feedback 34. Furthermore, the converter bias input 36 of the DC-DC converter 20 is connectible to the battery/DC source 22.

An alternative embodiment of the spur compensation block 61 is generally comprised of the first error amplifier 40, a second error amplifier 62, the gain adjustment network 42, the phase adjustment network 44, the output low pass filter circuit 46, and the output DC blocking capacitor 48. Connected to the first input 50 of the first error amplifier 40 are the aforementioned converter feedback 34 and the converter output 32. Again, the converter feedback 34 and the converter output 32 are first amplified with the gain adjustment network 42 before being applied to the first input 50. Connected to the second input 52 of the first error amplifier 40 is an output 64 of the second error amplifier 62, which is connected through the phase adjustment network 44. The output 64 is also connected to the converter reference input 38. A first input 66 of the second error amplifier 62 is connected to the voltage control signal source 54 VRAMP, while a second input 68 is connected to the output of the power detection block 63.

The error control signal from the spur compensation block 61, which is filtered by the output low pass filter circuit 46 and the output DC blocking capacitor 48 thereof, is passed to a power amplifier reference input 56 connected to the RF input 16 or the transistor base 30b. Also connected to the power amplifier reference input 56 is the reference voltage signal source 58, which in the second embodiment 10a, is understood to be a DC voltage. At both the power amplifier reference input 56 and the output of the DC-DC converter 20, there are RF blocking capacitors 60.

Returning to the features that define the closed loop power control, the RF output 18 is connected to a directional coupler 70 that passes the output RF signal to the aforementioned power detection block 63. More particularly, the directional coupler 70 has an input port 72 to which a first part 18a of the RF output is connected, as well as a transmitted port 74 to which a second part 18b of the RF output is connected. It is understood that the second part 18b of the RF output is what is connected to the antenna and/or the antenna switching networks. A coupled port 76 of the directional coupler 70 is connected to an input of the power detection block 63. Furthermore, an isolated port 78 is connected to ground through a matched resistor (typically 50-Ohm).

The power detection block 63 includes an attenuator 80 having an input connected to the coupled port 76 of the directional coupler 70, and an output connected to a diode 82. The power detection block 63 additionally defines a load resistance and capacitance, and so there may be an RC network 84 connected to the diode 82. The signal is amplified by amplifier 86 and passed to the second input 68 of the second error amplifier 62, thereby closing the control loop. The illustrated power detection block 63 is presented by way of example only and not of limitation. Any other suitable power detector architecture may be substituted without departing from the scope of the present disclosure.

Figure 4:
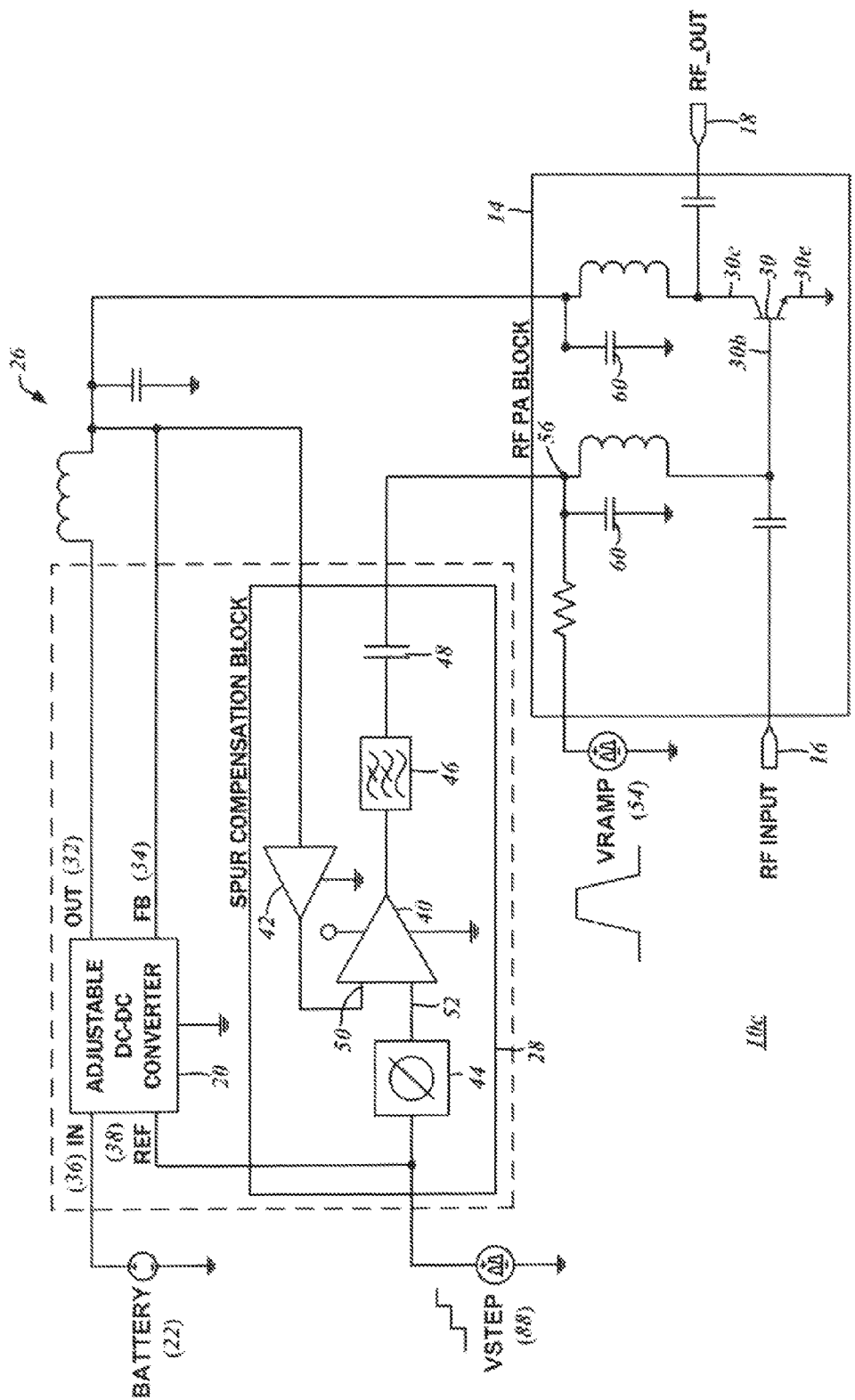
FIG. 4 is a circuit diagram of a third embodiment of the power control circuit.

Turning to FIG. 4, a third embodiment 10c of the power amplifier circuit is depicted. In almost all aspects, the third embodiment 10c is identical to the first embodiment 10a shown in FIG. 2, including the same power amplifier block 14, the DC-DC converter 20, and the spur compensation block 28, including the various components and configurations thereof. For the sake of brevity, those details will not be repeated.

Control of the power amplifier circuit 10c is different from the first embodiment 10a, however. Namely, the second input 52 of the error amplifier 40 and the converter reference input 38 are instead tied to a stepped reference signal 88, while the power amplifier reference input 56 is tied to the ramped voltage control signal source 54. In other words, the VRAMP signal that defines the RF power amplifier power level and its burst operation with appropriate shape and rise/fall time slope is applied to the base 30b of the transistor 30 of the power amplifier. The stepped reference signal VSTEP 88 is fixed at a predetermined voltage level during burst operation, and defines a constant bias level at the RF power amplifier collector 30c. In this regard, several different step control voltages can be applied over the RF output power dynamic range. Thus, both VSTEP and VRAMP signals ultimately correspond to a power amplifier output power.

Figure 5:
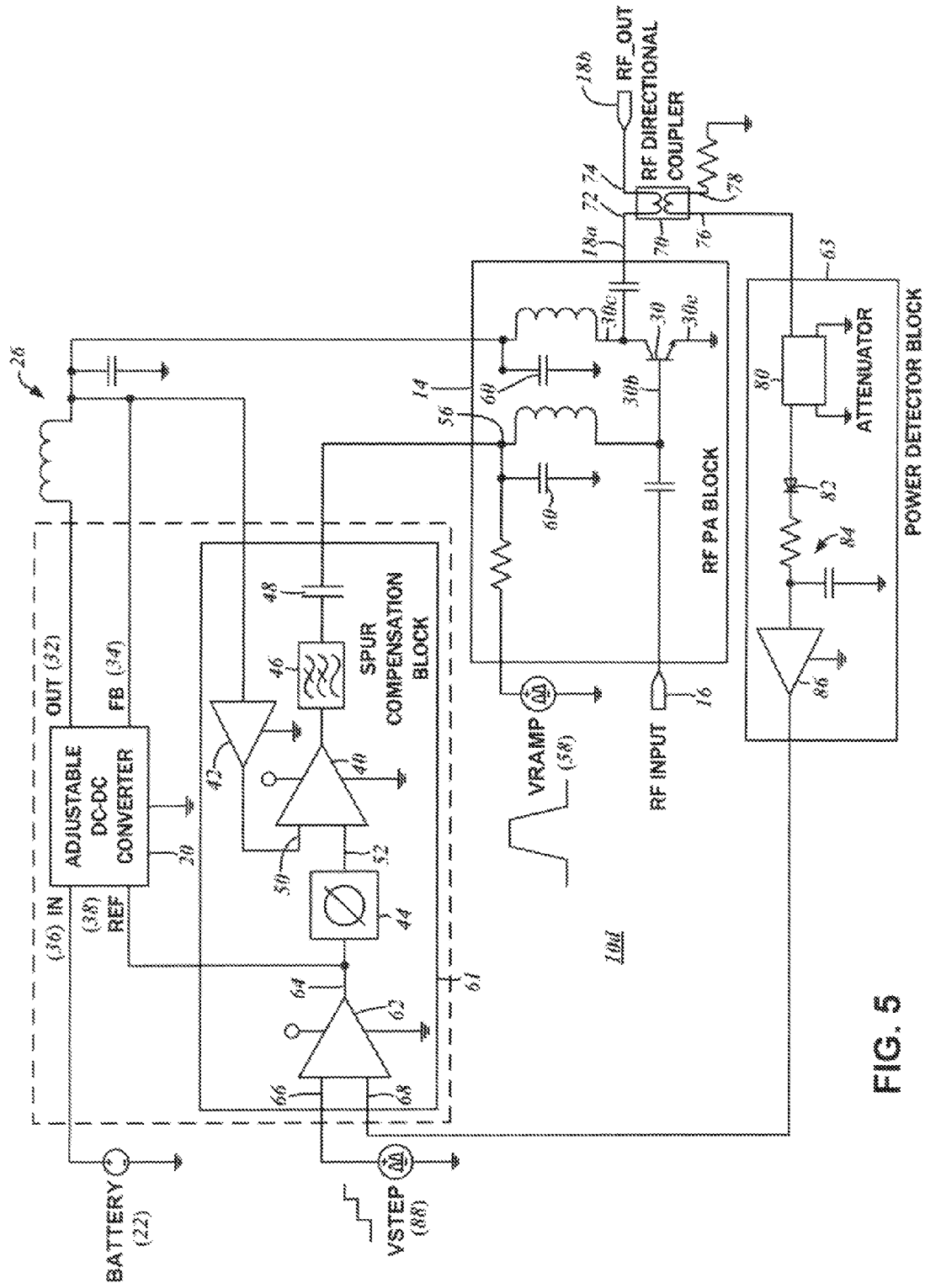
FIG. 5 is a circuit diagram of a fourth embodiment of the power control circuit also with closed-loop power control.

Similarly, as shown in FIG. 5, a fourth embodiment 10d is substantially the same as the second embodiment 10b, except for the control features. The power amplifier block 14, spur compensation block 61, the DC-DC converter 20, the power detection block 63, and the directional coupler 70 as utilized and configured in the second embodiment 10b are the same in the fourth embodiment 10d, and so they will not be repeated. The ramped voltage control signal source 58 that at least partially defines the RF power level and its burst operation is instead applied to the power amplifier reference input 56, that is, the base 30b of the transistor 30 that corresponds to the RF input 16. Again, the stepped reference signal VSTEP 88 is connected to the first input 66 of the second error amplifier 62. This signal is fixed at a predetermined voltage level during burst operation, and defines a constant bias level at the RF power amplifier collector 30c. Like the third embodiment 10c discussed above, different step control voltages can be applied over the RF output power dynamic range.

Figure 6:
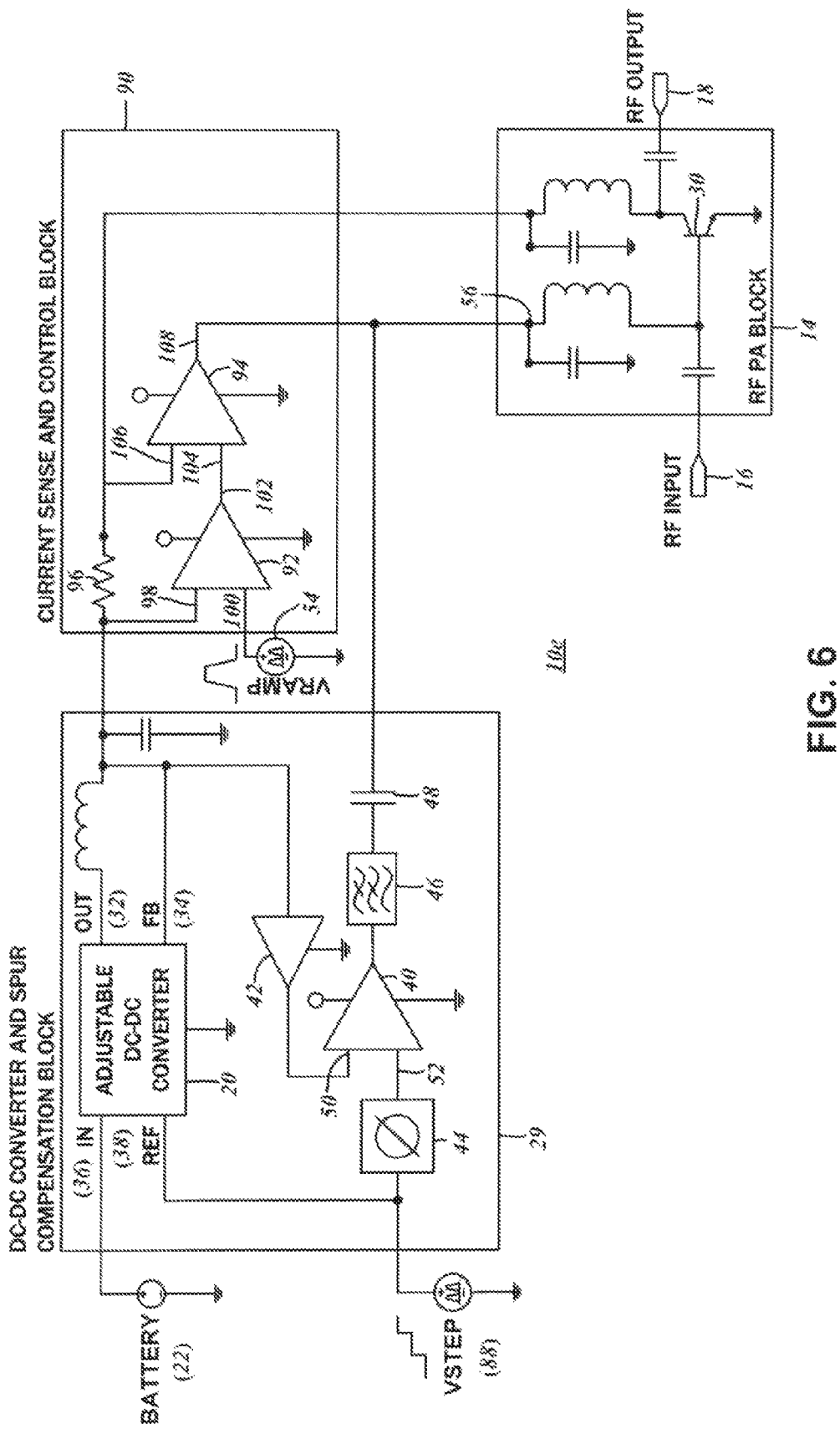
FIG. 6 is a circuit diagram of a fifth embodiment of the power control circuit with an open-loop power control.

The schematic diagram of FIG. 6 shows a fifth embodiment 10e of the power amplifier circuit, which is understood to utilize an alternative open-loop power control by current sensing. Though depicted as a combined DC-DC converter and spur compensation block 29, it utilizes the same constituent spur compensation block 28 and the DC-DC converter 20 of the fourth embodiment 10c shown in FIG. 4. Additionally, the same power amplifier block 14 from the fourth embodiment 10c is utilized. This embodiment 10e, like the third embodiment 10c, includes a stepped reference signal VSTEP 88 that is connected to the converter reference input 38 of the DC-DC converter 20 and the error amplifier 40.

The fifth embodiment 10e detects power through a current sense and control block 90, which includes a first current sense error amplifier 92, a second current sense error amplifier 94, and a current sense resistor 96. Generally, the current sense and control block is connected to the converter output 32 of the DC-DC converter 20, as well as inputs to the power amplifier block 14. As discussed above, the power amplifier block 14 is biased with the DC voltage provided by the DC-DC converter 20, and so one of the connections to the power amplifier block 14 is tied to the collector 30c of the transistor 30. A reference voltage is also provided, which is tied to the base 30b of the transistor 30. There are separate connections from the current sense and control block 90 to these power amplifier inputs.

The output of the DC-DC converter 20 is connected to a first input 98 of the second error amplifier 94, while the voltage control signal source 54, e.g., the VRAMP which defines the RF power amplifier output power level and its burst operation, is connected to a second input 100 of the first current sense error amplifier 92 Furthermore, an output of 102 of the second current sense error amplifier 94 is connected to a first input 104 of the second current sense error amplifier 94. Connected across the first input 98 of the first error amplifier 92 and a second input 106 of the second current sense error amplifier 94 is the current sense resistor 96. The collector current drawn through the power amplifier block 14 is understood to be detected by the current sense resistor 96, and is proportional to the RF output power. This current is applied to the second current sense error amplifier 94, which is compared with the voltage control signal 54 source VRAMP. An output 108 of the second current sense error amplifier 94, together with the output from the spur compensation block 28, is applied to the power amplifier reference input 56.

The foregoing embodiments of the power amplifier circuit 10a-10e may be used to improve power efficiency while baseband, analog, and RF circuits implemented with conventional and future semiconductor technologies to increase talk time between battery charges In four-slot operating modes, talk times can be increased by 37% to 50% by reducing average power amplifier current consumption by two to three times over conventional devices. In one-slot operation, improvements in talk time can be expected to reach 20% to 25% by increasing efficiency by two times over conventional devices, and 25% to 30% by increasing efficiency by three times over conventional devices. Accordingly, new GSM/GPRS handset designs, being unburdened by battery consumption problems otherwise associated with power control circuits for power amplifiers, can incorporate additional features that further improves its utility but may require additional power.

The particulars shown herein are by way of example and for purposes of illustrative discussion of the embodiments of the present disclosure only and are presented in the cause of providing what is believed to be the most useful and readily understood description of the principles and conceptual aspects thereof. In this regard, no attempt is made to show details of the various embodiments with more particularity than is necessary for the fundamental understanding of the present disclosure, the description taken with the drawings making apparent to those skilled in the art how the several forms may be embodied in practice.

What is claimed is:

1. An RF power amplifier circuit, comprising:
   a power amplifier block including one or more stages of RF power amplifiers with a power amplifier input connectible to an RF transceiver transmission port, a power amplifier output connectible to an antenna, and a power amplifier reference input tied to the power amplifier input;
   a power converter block including a DC-DC power converter with a converter bias input connectible to a DC source, a converter output connectible to the power amplifier block to bias the one or more stages of RF power amplifiers with a bias voltage signal, a converter feedback, and a converter reference input connected to a voltage control signal source corresponding to an RF power output level; and
   a spur compensation block including an error amplifier, the converter feedback and the converter output being connected to a first input of the error amplifier and the voltage control signal source being connected to a second input of the error amplifier through a phase adjustment network, an output of the error amplifier generating an error control signal and connected to the power amplifier reference input together with a reference voltage signal source;
   wherein the bias voltage signal is opposite the error control signal, with voltage ripple spurs in the bias voltage signal being counteracted by the error control signal.

2. The RF power amplifier circuit of claim 1, wherein:
   the voltage control signal source generates a ramp signal defined by a ramp shape, a ramp rise time slope and a ramp fall time slope; and
   the reference voltage signal source generates a DC voltage signal.

3. The RF power amplifier circuit of claim 1, wherein the output port of the RF power amplifier is connectible to the antenna through a switching network.

4. The RF power amplifier circuit of claim 1, wherein the power converter block includes an output filter connected to the converter output.

5. The RF power amplifier circuit of claim 1, wherein the spur compensation block further includes a gain adjustment network connected to the converter feedback and the converter output, and the first input of the error amplifier.

6. The RF power amplifier circuit of claim 1, wherein the spur compensation block further includes an output low pass filter connected to the output of the error amplifier and the power amplifier reference input.

7. The RF power amplifier circuit of claim 1, wherein the spur compensation block further includes a DC blocking capacitor connected to the output of the error amplifier and the power amplifier reference input.

8. The RF power amplifier circuit of claim 1, wherein the power amplifier block includes an RF blocking capacitor.

9. The RF power amplifier circuit of claim 8, wherein the RF blocking capacitor is tied to the power amplifier reference input.

10. The RF power amplifier circuit of claim 8, wherein the RF blocking capacitor is tied to the power amplifier output.

11. A closed-loop control RF power amplifier circuit, comprising:
   a power amplifier block including one or more stages of RF power amplifiers with a power amplifier input connectible to an RF transceiver transmission port, a power amplifier output connectible to an antenna, and a power amplifier reference input tied to the power amplifier input;
   an power converter block including a DC-DC power converter with a converter bias input connectible to a DC source, a converter output connectible to the power amplifier block to bias the one or more stages of RF power amplifiers with a bias voltage signal, a converter feedback, and a converter reference input; and
   a spur compensation block including a first error amplifier and a second error amplifier each including a first input, a second input, and an output, the converter feedback and the converter output being connected to the first input of the first error amplifier, the output of the second error amplifier being connected to the second input of the first error amplifier through a phase adjustment network and the converter reference input, the output of the first error amplifier generating an error control signal and connected to the power amplifier reference input together with a reference voltage signal source, and the first input of the second error amplifier being connected to a voltage control signal source;
   a power detector block including an input connected to the power amplifier output and an output connected to the second input of the second error amplifier.

12. The closed-loop control RF power amplifier circuit of claim 11, further comprising:
a directional coupler including an input port connected to the power amplifier output, a transmitted port connectible to the antenna, a coupled port connected to the input of the power detector block, and an isolated port connected to ground.

13. The closed-loop control RF power amplifier circuit of claim 12, wherein the power detector block further includes an attenuator and defines a load resistance and capacitance.

14. The closed-loop control RF power amplifier circuit of claim 13, wherein the power detector block further includes a diode connected to the attenuator and the output the power detector block.

15. The closed-loop RF power amplifier circuit of claim 13, wherein the power detector block further includes an amplifier with an input connected to the attenuator and an output connected to the second input of the second error amplifier.

16. An RF power amplifier circuit, comprising:
a power amplifier block including one or more stages of RF power amplifiers with a power amplifier input connectible to an RF transceiver transmission port, a power amplifier output connectible to an antenna, and a power amplifier control input tied to the power amplifier input;
a power converter block including a DC-DC power converter with a converter bias input connectible to a DC source, a converter output connectible to the power amplifier block to bias the one or more stages of RF power amplifiers with a bias voltage signal, a converter feedback, and a converter reference input connected to a stepped voltage reference signal source corresponding to an RF power output level; and
a spur compensation block including an error amplifier, the converter feedback and the converter output being connected to a first input of the error amplifier and the stepped voltage reference signal source being connected to a second input of the error amplifier through a phase adjustment network, an output of the error amplifier generating an error control signal and connected to the power amplifier reference input together with a voltage control signal source;
wherein the bias voltage signal is opposite in phase of the error control signal, with voltage ripple spurs in the bias voltage signal being counteracted by the error control signal.

17. The RF power amplifier circuit of claim 16, wherein:
the voltage control signal source generates a ramp signal defined by a ramp shape, a ramp rise time slope and a ramp fall time slope.

18. A closed-loop control RF power amplifier circuit, comprising:
a power amplifier block including one or more stages of RF power amplifiers with a power amplifier input connectible to an RF transceiver transmission port, a power amplifier output connectible to an antenna, and a power amplifier control input tied to the power amplifier input;
a power converter block including a DC-DC power converter with a converter bias input connectible to a DC source, a converter output connectible to the power amplifier block to bias the one or more stages of RF power amplifiers with a bias voltage signal, a converter feedback, and a converter reference input connected to a stepped voltage reference signal source corresponding to an RF power output level; and
a spur compensation block including an error amplifier, the converter feedback and the converter output being connected to a first input of the error amplifier and the stepped voltage reference signal source being connected to a second input of the error amplifier through a phase adjustment network, an output of the error amplifier generating an error control signal and connected to the power amplifier reference input together with a voltage control signal source;
a power detector block including an input connected to the power amplifier output and an output connected to the second input of the second error amplifier.

19. The RF power amplifier circuit of claim 18, wherein:
the voltage control signal source generates a ramp signal defined by a ramp shape, a ramp rise time slope and a ramp fall time slope.

20. An open-loop RF power amplifier circuit, comprising:
a power amplifier block including one or more stages of RF power amplifiers with a power amplifier input connectible to an RF transceiver transmission port and a power amplifier output connectible to an antenna;
a voltage converter and spur compensation block including:
a DC-DC converter with a converter bias input connectible to a DC source, a converter output, a converter feedback, and a converter reference input connected to a stepped voltage reference signal source;
a first error amplifier including a first input, a second input, and an output, the converter feedback and the converter output being connected to the first input of the first error amplifier and the output being connected to the power amplifier input;
a phase adjustment network connected to the stepped voltage reference signal source and the second input of the first error amplifier;
a current sense and control block with an input connected to the voltage converter and spur compensation block and an output connected to the power amplifier block, including:
a first current sense error amplifier having a first input connected to a voltage control signal source, a second input connected to the converter output, and an output;
a second current sense error amplifier having a first input connected to the output of the second amplifier, a second input, and an output connected to the power amplifier input; and
a sensing resistor connected across the second input of the first current sense error amplifier and the second input of the second current sense error amplifier, the second input of the second current sense error amplifier defining the output of the current sense and control block.

21. The open-loop RF power amplifier circuit of claim 20, wherein:
the voltage control signal source generates a ramp signal defined by a ramp shape, a ramp rise time slope and a ramp fall time slope.

22. The open-loop RF power amplifier circuit of claim 20, wherein the spur compensation block further includes a gain adjustment network connected to the converter feedback and the converter output, and the first input of the first error amplifier.

23. The open-loop RF power amplifier circuit of claim 20, wherein the spur compensation block further includes an output low pass filter connected to the output of the first error amplifier and the power amplifier reference input.

* * * * *